US011191357B1

(12) United States Patent
Jhou et al.

(10) Patent No.: US 11,191,357 B1
(45) Date of Patent: Dec. 7, 2021

(54) REMOVABLE SELF-UNLOCKING STRUCTURE

(71) Applicant: AIC INC., Taoyuan (TW)

(72) Inventors: Siang-An Jhou, Taoyuan (TW); Wei-Shih Wu, Taoyuan (TW)

(73) Assignee: AIC INC., Taoyuan (TW)

( * ) Notice: Subject to any disclaimer, the term of this patent is extended or adjusted under 35 U.S.C. 154(b) by 0 days.

(21) Appl. No.: 16/886,772

(22) Filed: May 29, 2020

(51) Int. Cl.
*A47B 88/919* (2017.01)
*H05K 7/14* (2006.01)

(52) U.S. Cl.
CPC .............. *A47B 88/919* (2017.01); *H05K 7/14* (2013.01)

(58) Field of Classification Search
CPC ................................ H05K 7/14; H05K 7/1401
See application file for complete search history.

(56) References Cited

U.S. PATENT DOCUMENTS

| | | | | |
|---|---|---|---|---|
| 8,346,046 B2* | 1/2013 | Wagner | ..................... | H04Q 1/13 385/135 |
| 10,492,324 B2* | 11/2019 | Miura | .................. | H05K 7/1418 |
| 11,048,057 B2* | 6/2021 | Berridge | .............. | H05K 7/1489 |
| 2015/0048726 A1* | 2/2015 | Ding | ........................ | H05K 7/14 312/223.2 |
| 2020/0303693 A1* | 9/2020 | Zhang | ................. | H01M 50/209 |
| 2021/0131450 A1* | 5/2021 | Yang | ....................... | F04D 25/16 |

* cited by examiner

*Primary Examiner* — Daniel J Rohrhoff
(74) *Attorney, Agent, or Firm* — Chun-Ming Shih; HDLS IPR Services

(57) ABSTRACT

A removable self-unlocking structure includes a case and a frame body. The case has a latching portion. The frame body includes a frame plate, and the frame plate is disposed with a positioning structure. The positioning structure includes a slot and an elastic arm exposed in the slot. When the frame body is exerted by an external force, and the elastic arm is capable of positioning at the latching portion or detaching from the latching portion, so that the frame body can slide relative to the case for increasing the convenience of use.

18 Claims, 11 Drawing Sheets

REMOVABLE SELF-UNLOCKING STRUCTURE

BACKGROUND OF THE INVENTION

Field of the Invention

The present invention generally relates to a latch structure, and more particular, to a removable self-unlocking structure.

Description of Prior Art

Most electronics use multiple screws to lock frames to the case. Furthermore, electronic products using multiple screws to lock to the case is very time-consuming and laborious, and it is cumbersome and inconvenient when repairing or replacing.

In view of the above drawbacks, the Inventor proposes the present invention based on his expert knowledge and elaborate researches in order to solve the problems of prior art.

SUMMARY OF THE INVENTION

Accordingly, an object of the present invention is to provide a removable self-unlocking structure, in which the frame body is provided with an elastic arm and the elastic arm can be positioned at a latching portion of the case for combining with the case.

In order to achieve the object mentioned above, the present invention provides a removable self-unlocking structure for combining with a case having latching portions. The removable self-unlocking structure includes a case and a frame body. The case has a latching portion. The frame body includes a frame plate, and the frame plate is disposed with a positioning structure. The positioning structure includes a slot and an elastic arm exposed in the slot. When the frame body is exerted by an external force, and the elastic arm is capable of positioning at the latching portion or detaching from the latching portion, so that the frame body can slide relative to the case.

Comparing to the prior art, when the removable self-unlocking structure of the present invention is inserted in the case, the frame body can be engaged with the latching portion of the case through the elastic arm of the positioning structure; thereby, the frame body can be quickly positioned in the case without using screws. Moreover, the frame body can be driven to push the elastic arm away from the latching portion. Therefore, the frame body can be removed from the case, and the convenience of use is increased.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, not being used to limit its executing scope. Any equivalent variation or modification made according to appended claims is all covered by the claims claimed by the present invention.

Figure 1:
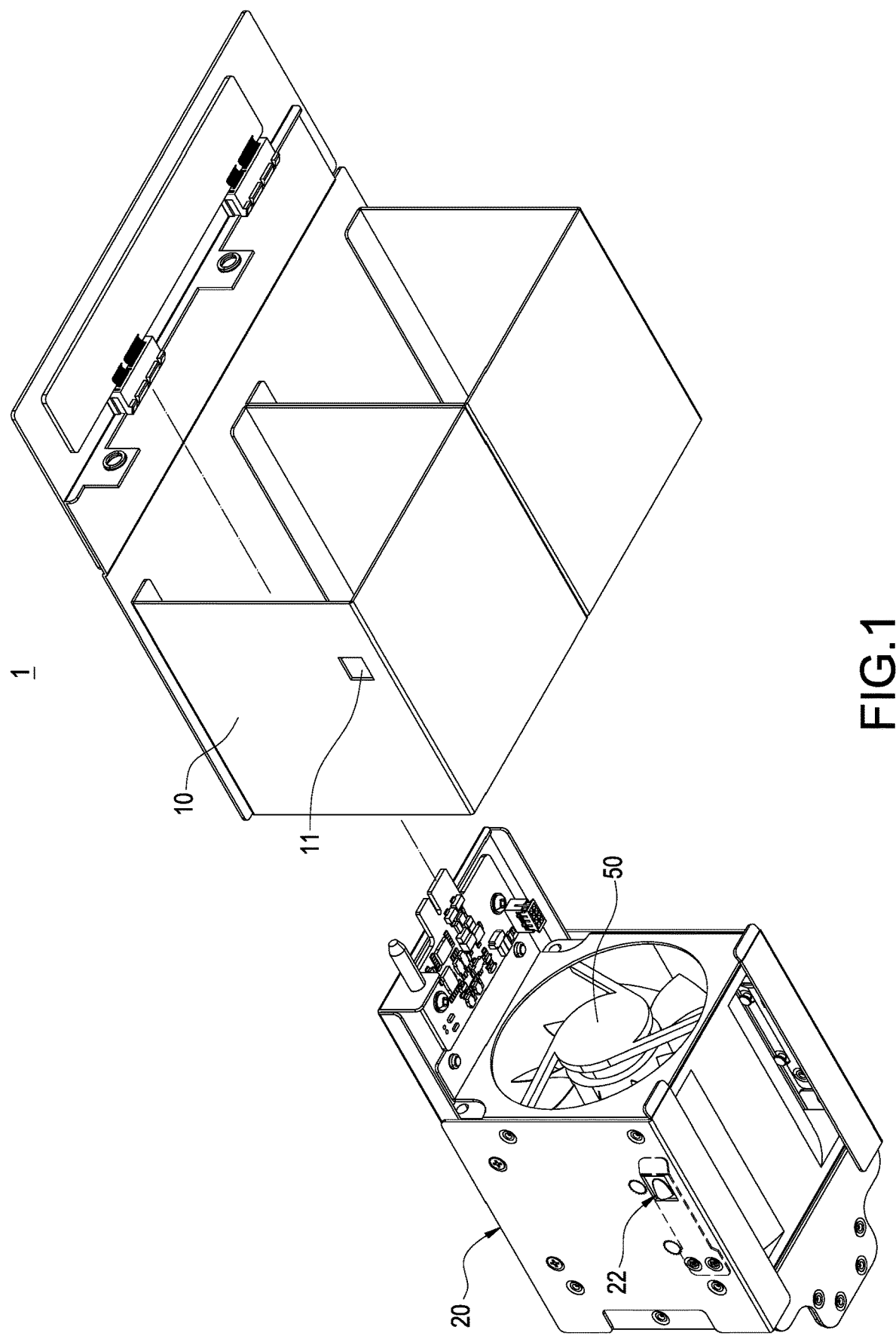
FIG. 1 is a combination schematic view of the removable self-unlocking structure of the present invention.
Figure 2:
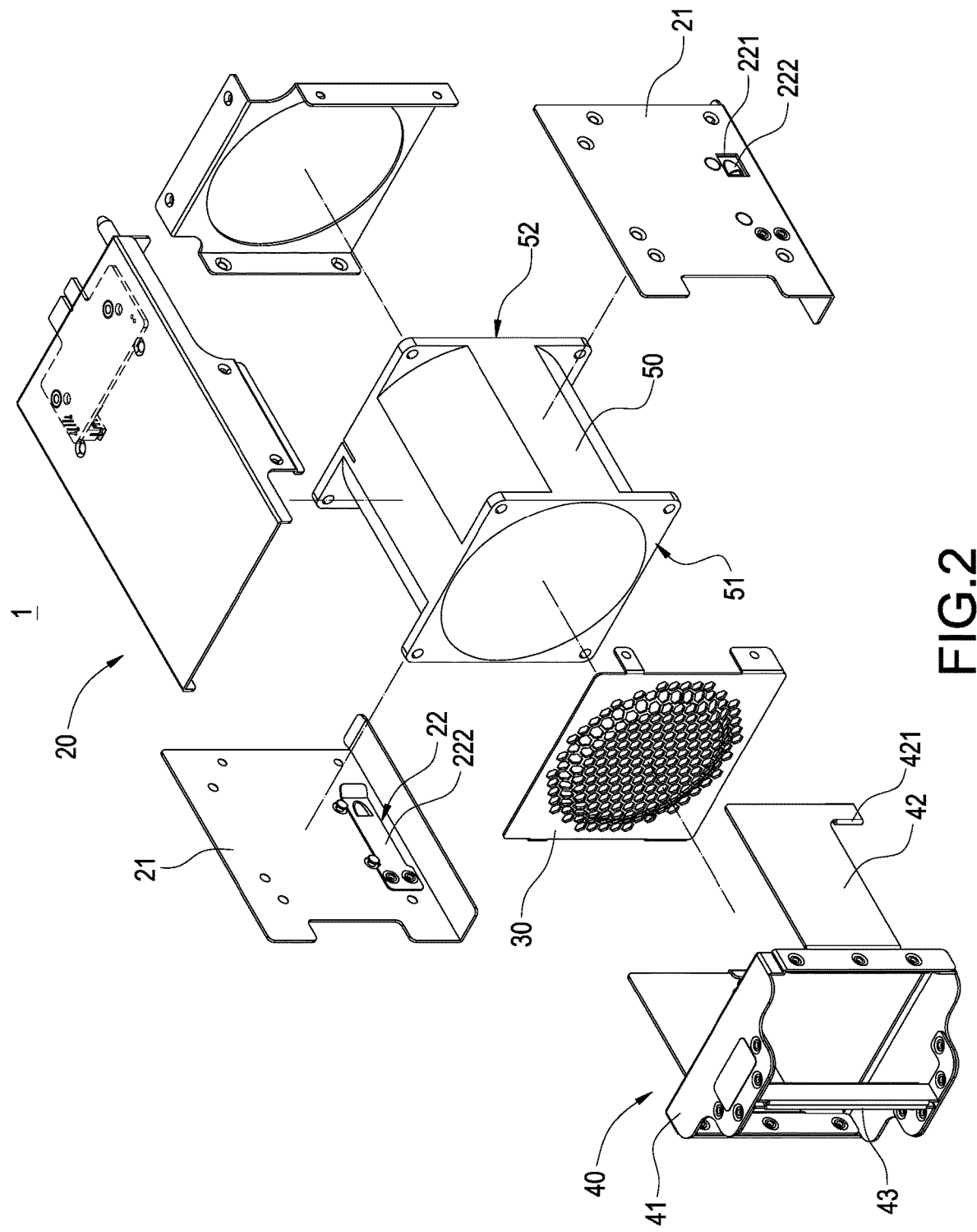
FIG. 2 is a perspective exploded view of the removable self-unlocking structure of the present invention.

Please refer to FIG. 1 and FIG. 2, which depict combination schematic view of the removable self-unlocking structure and a perspective exploded view of the removable self-unlocking structure of the present invention. The present invention is a removable self-unlocking structure 1 including a case 10 and a frame body 20. The frame body 20 is combined with the casing 10 in a removable manner to constitute the removable self-unlocking structure 1.

The case 10 has a latching portion 11. Furthermore, the frame body 20 is combined in the case 10 in a removable manner and positioned in the case 10 through the latching portion 11. In the present embodiment, the latching portion 11 is a locking hole, but it is not restricted in actual implementation.

The frame body 20 includes a frame plate 21. In the present embodiment, the frame plate 21 is disposed with a positioning structure 22. The positioning structure 22 includes a slot 221 and an elastic arm 222 having at least one part thereof exposed in the slot 221. The frame body 20 is capable of sliding relative to the case 10 by an external force. Thereby, when the frame body 20 slides into the case 10, the elastic arm 222 can be positioned at the latching portion 11 of the case 10, and then the frame body 20 can be combined in the case 10. On the other hand, the elastic arm 222 can be disengaged from the latching portion 11 of the case 10 by an external force, so that the frame body 20 can be removed from the case 10.

In real practice, the removable self-unlocking structure 1 further includes a device body 50. In the present embodiment, the device body 50 is a fan. The frame body 20 covers the device body 50 and is fixed thereon. The device body 50 can be removed through the removable self-unlocking structure 1.

In one embodiment of the present invention, the removable self-unlocking structure 1 further includes a protection plate 30, and the protection plate 30 is provided with a plurality of ventilation holes 31. Specifically, the device body 50 has an air inlet side 51 and an air outlet side 52, and the protection plate 30 is arranged at an outer side of the air inlet side 51 for external air accessing therein and preventing external objects from entering the device body 50.

Preferably, the removable self-unlocking structure 1 further includes a holding assembly 40. The holding assembly 40 is disposed at an outer side of the frame body 20 and is fixed thereon.

It is worth of noting that, in the present embodiment, frame plates 21 located on opposite sides of the device body 50 are provided with a positioning structure 22 separately. Moreover, opposite sides of the case 10 is provided with a latching portion 11 separately corresponding to the positioning structure 22.

Figure 3:
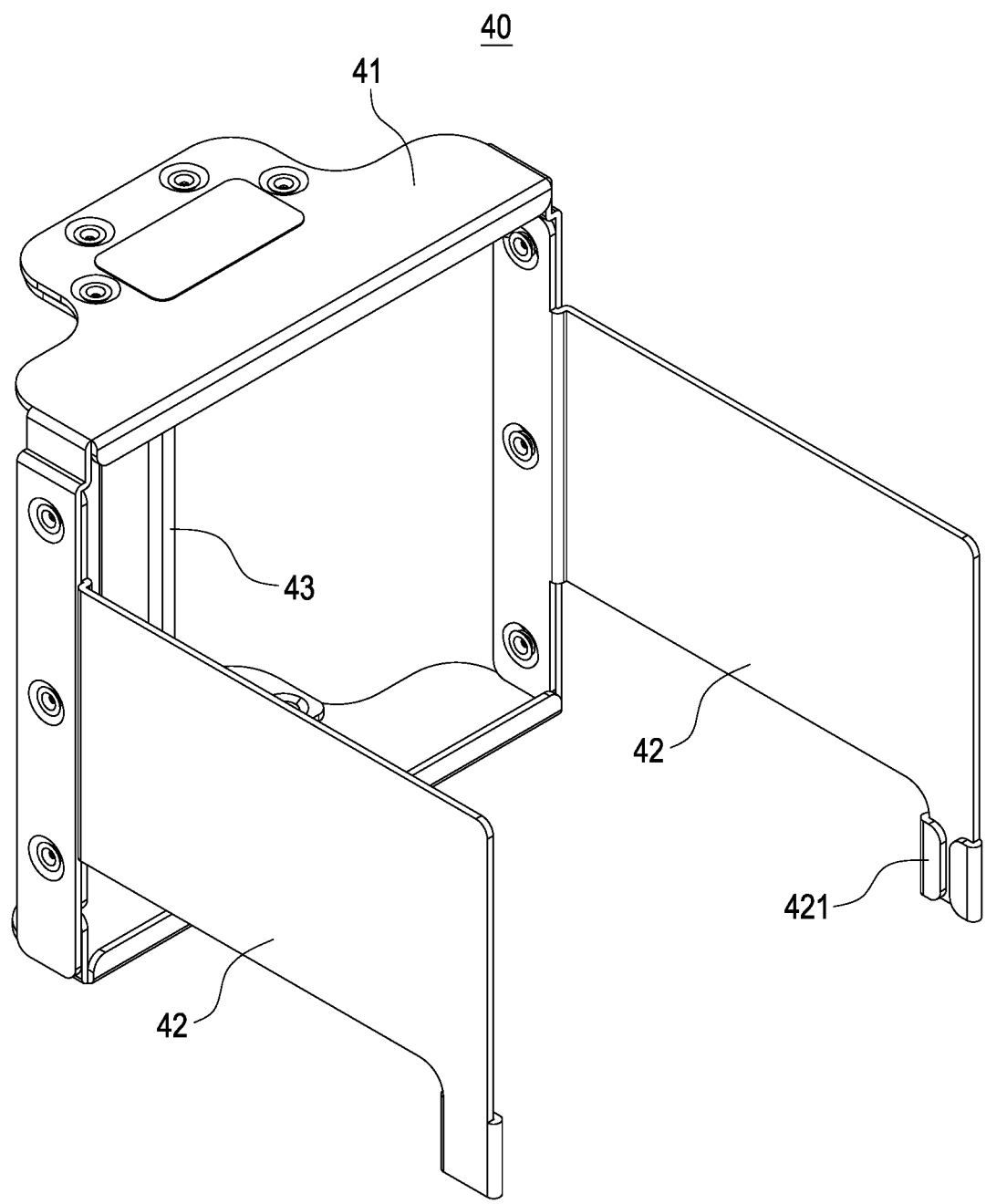
FIG. 3 is a perspective schematic view of the holding assembly of the present invention.

Please also refer to FIG. 3, which depicts a perspective schematic view of the holding assembly of the present invention. In the present embodiment, the holding assembly 40 includes a supporting frame 41, a pair of supporting plates 42 coupled to opposite sides of the supporting frame 41, and a handle 43 coupled to the supporting frame 41. Two ends of the handle 43 are fixed on opposite sides of the supporting frame 41.

In more detail, a bottom of each of the support plates 42 is folded to form a pushing portion 421, and the pushing portion 421 is provided to push the elastic arm 222 away from the latching portion 11.

Figure 4:
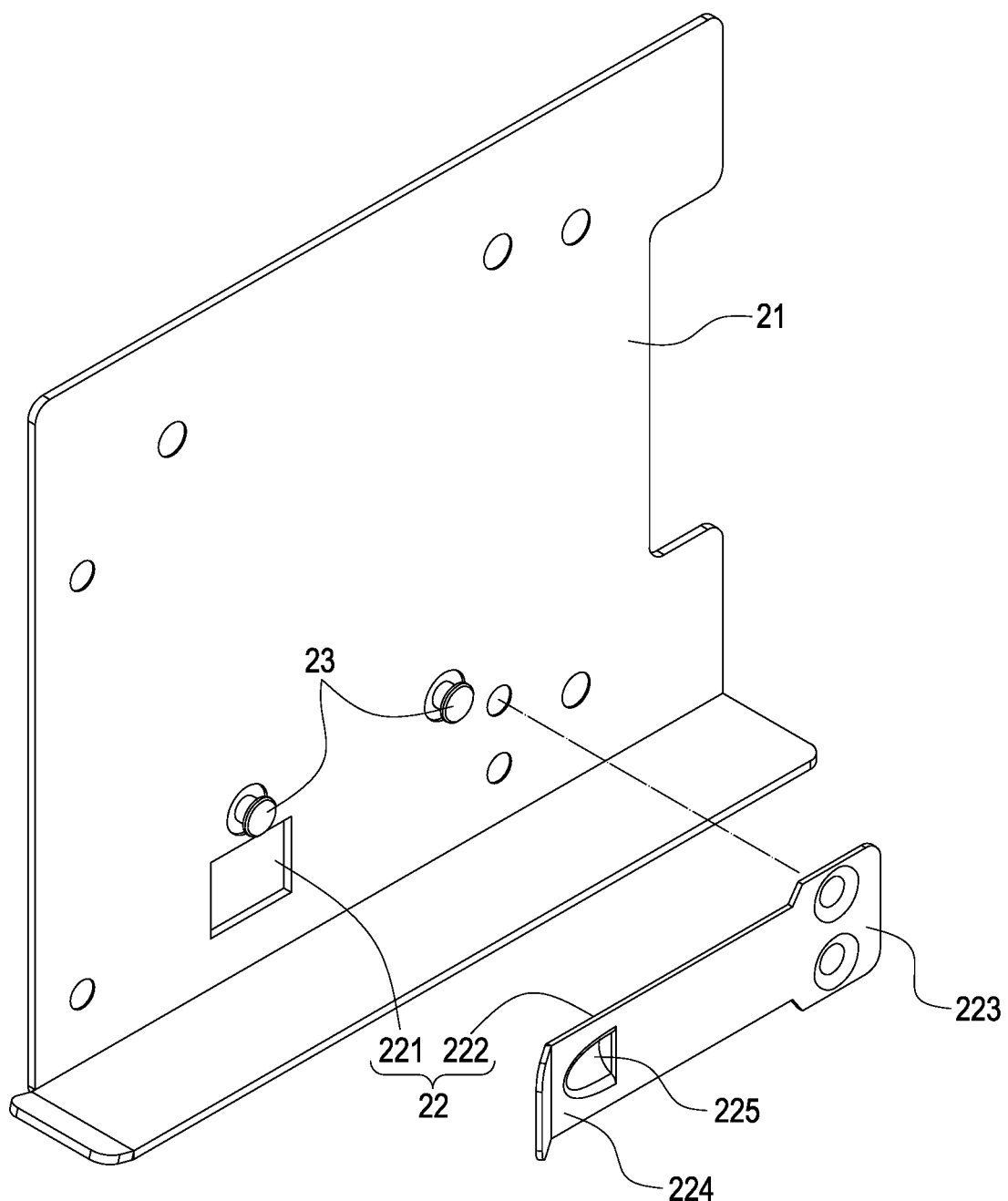
FIG. 4 is a perspective exploded view of the frame plate and positioning structure of the present invention.
Figure 5:
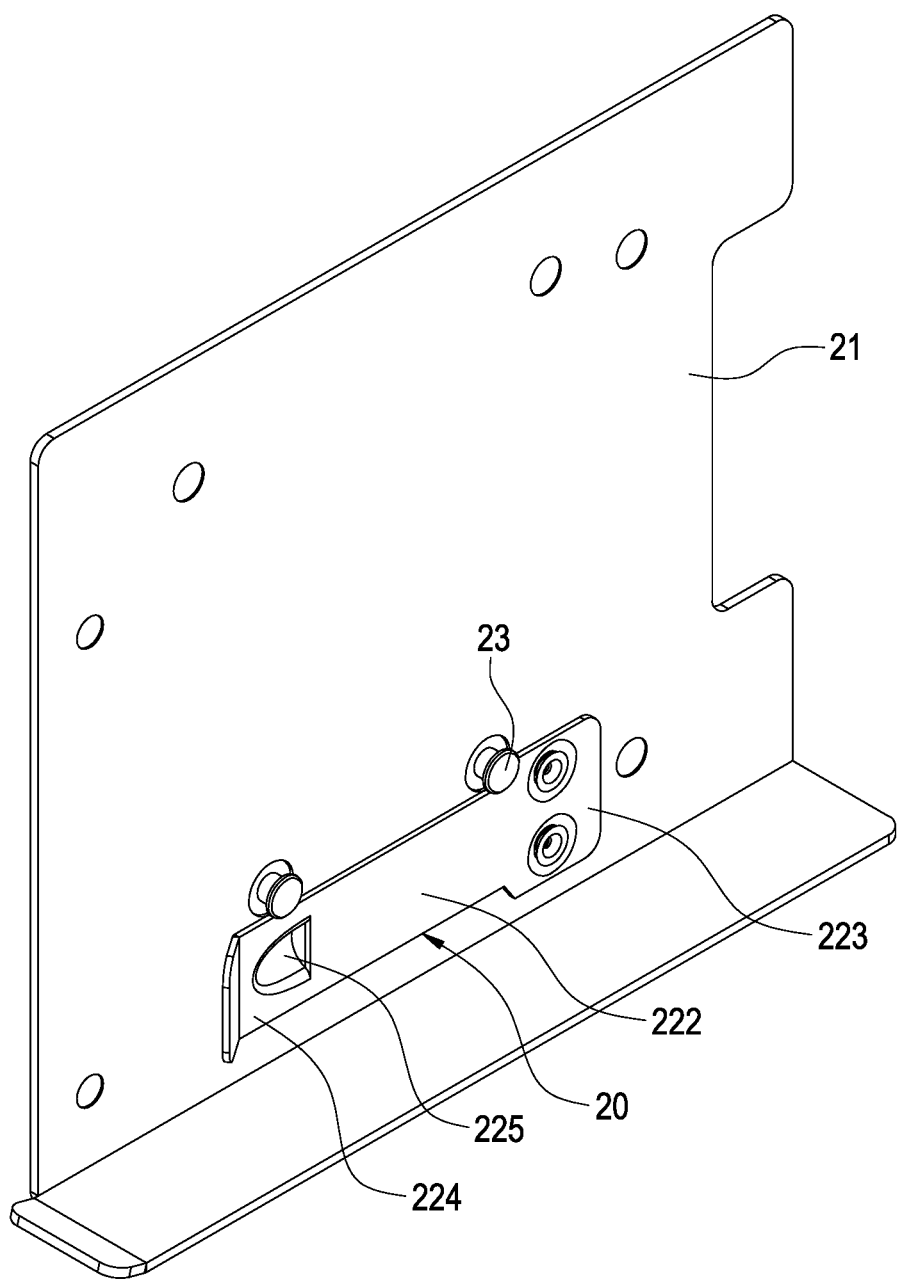
FIG. 5 is a combination schematic view of the frame plate and positioning structure of the present invention.

Please further refer to FIG. 4 and FIG. 5, which depict a perspective exploded view and a combination schematic view of the frame plate and positioning structure of the present invention. The positioning structure 22 of the present invention includes a slot 221 and an elastic arm 222 having at least one part thereof exposed in the slot 221. In the present embodiment, the elastic arm 222 is a spring piece disposed separately. The elastic arm 222 has a fixed end 223 and a positioning end 224. The fixed end 223 is riveted on a side of the frame plate 21 facing the device body 50, and the way of combination is not limited thereto. Moreover, the frame body 20 is positioned on the case 10 through the positioning end 224 engaging with the latching portion 11 of the case 10. Specifically, the positioning end 224 has a bump 225, and the bump 225 is nail-shaped and exposed in the slot 221.

It should be noted that, the positioning structure 22 is not limited to the structure aforementioned. In real implementation, the elastic arm 222 can also be directly formed on the frame plate 21 by stamping.

In the present embodiment, the frame plate 21 is disposed with at least one blocking post 23 on a side of the frame plate 21 facing the device body 50, and the at least one blocking post 23 abuts against an edge of the elastic arm 222. In addition, the disposition of the blocking post 23 can prevent the elastic arm 222 from being excessively deformed by an external force; thereby, the positioning effect can be maintained. In the present embodiment, the frame plate 21 is disposed with a plurality of blocking posts 23, and the blocking posts 23 are spaced apart on an outer side of the elastic arm 222.

Figure 6:
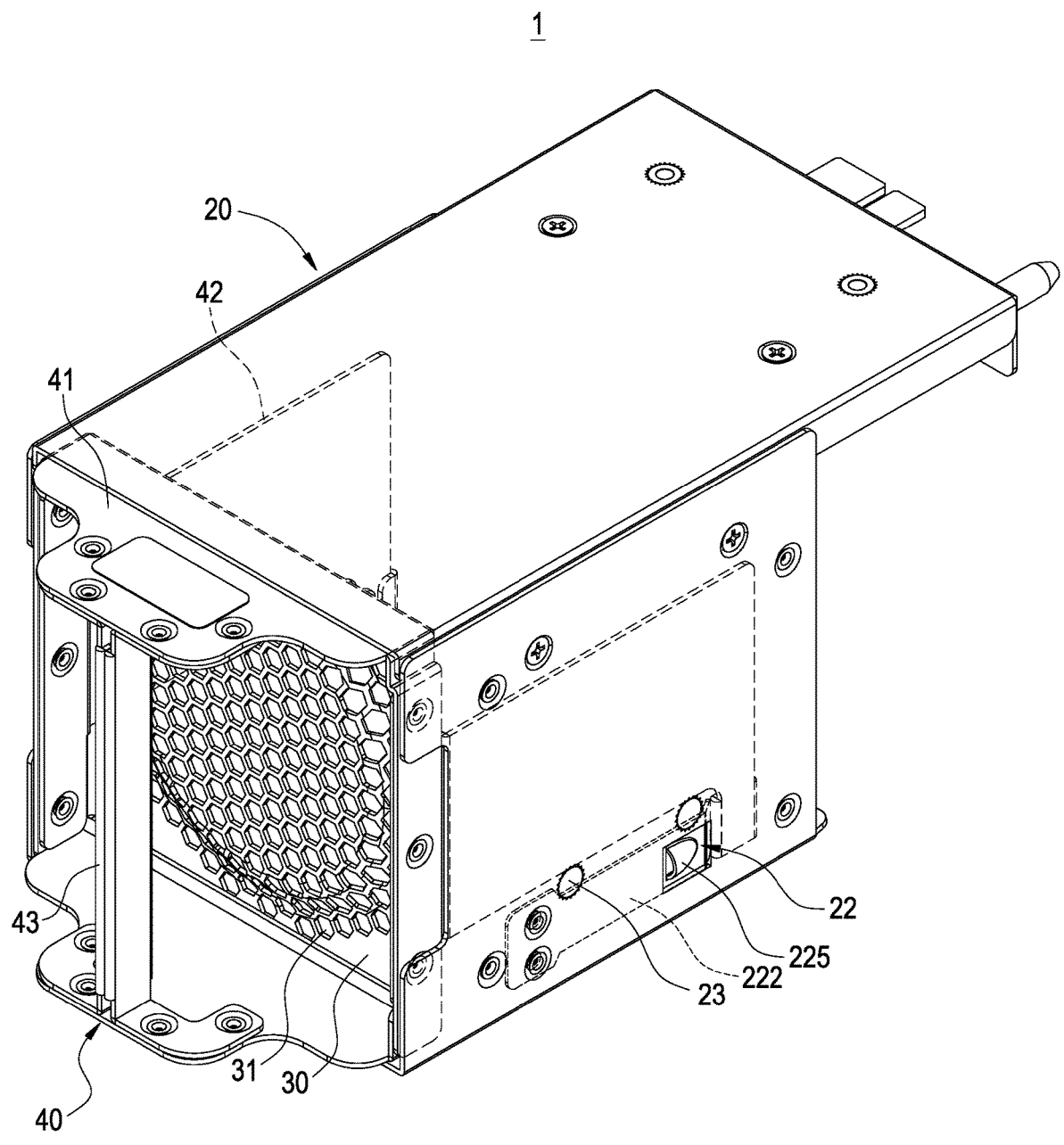
FIG. 6 is a perspective schematic view of the holding assembly coupled to the frame body of the present invention.

Please further refer to FIG. 6, which depicts a perspective schematic view of the holding assembly coupled to the frame body of the present invention. The frame body 20 includes a frame plate 21. In the present embodiment, frame plates 21 located at both sides have a positioning structure 22 separately. Moreover, the protection plate 30 and the holding assembly 40 are disposed on a rear side of the frame body 20.

It is worth noting that, the pair of supporting plates 42 of the holding assembly 40 are attached to inner sides of the frame plates 21 on both sides, and the pushing portion 421 folded and formed at the bottom of the supporting plate 42 is located at a side of the positioning structure 22. Thereby, the pushing portion 421 can push the elastic arm 222 away from the latching portion 11 to disengage the frame body 20.

Figure 7:
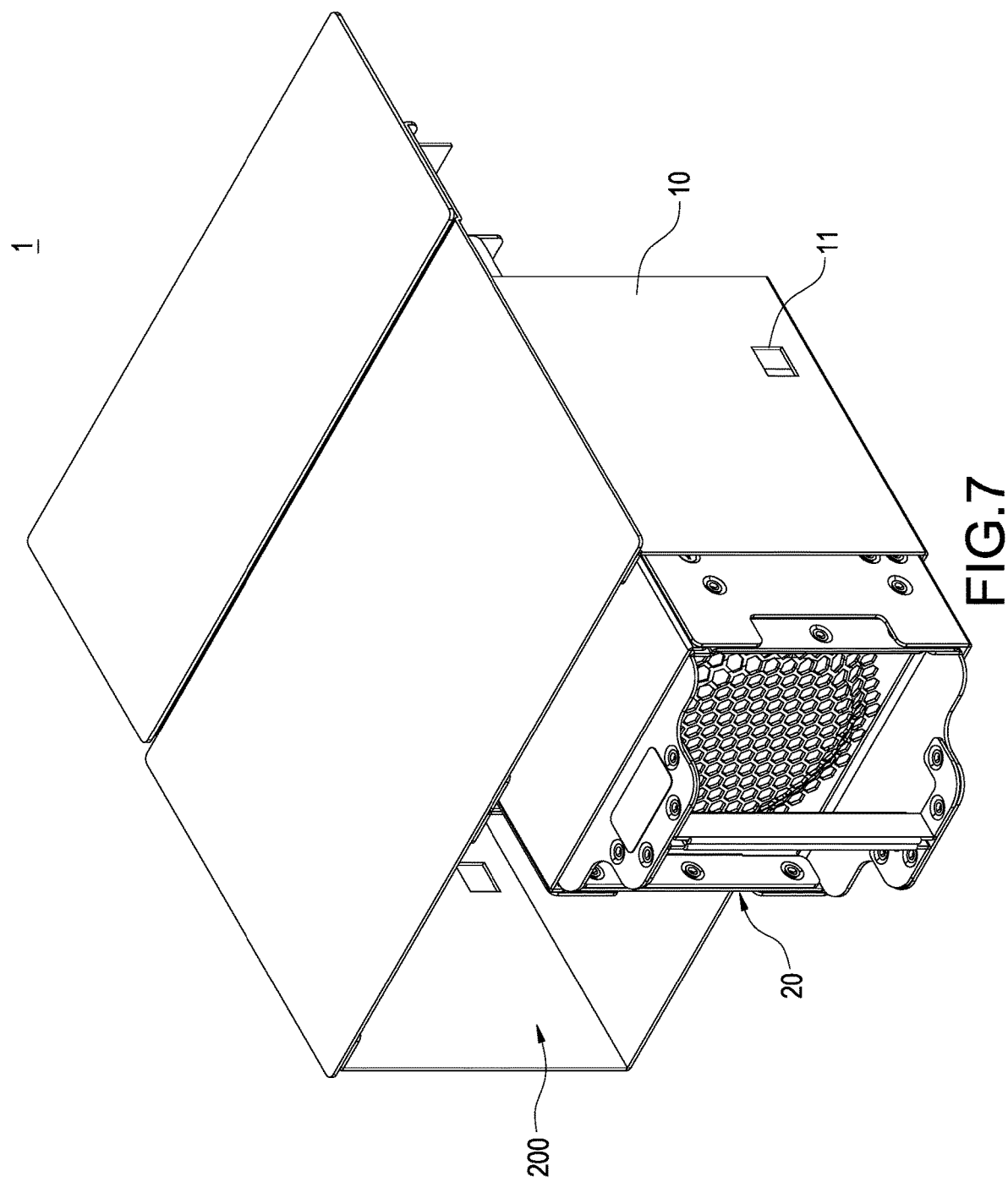
FIG. 7 is a perspective schematic view of the removable self-unlocking structure of the present invention.
Figure 8:
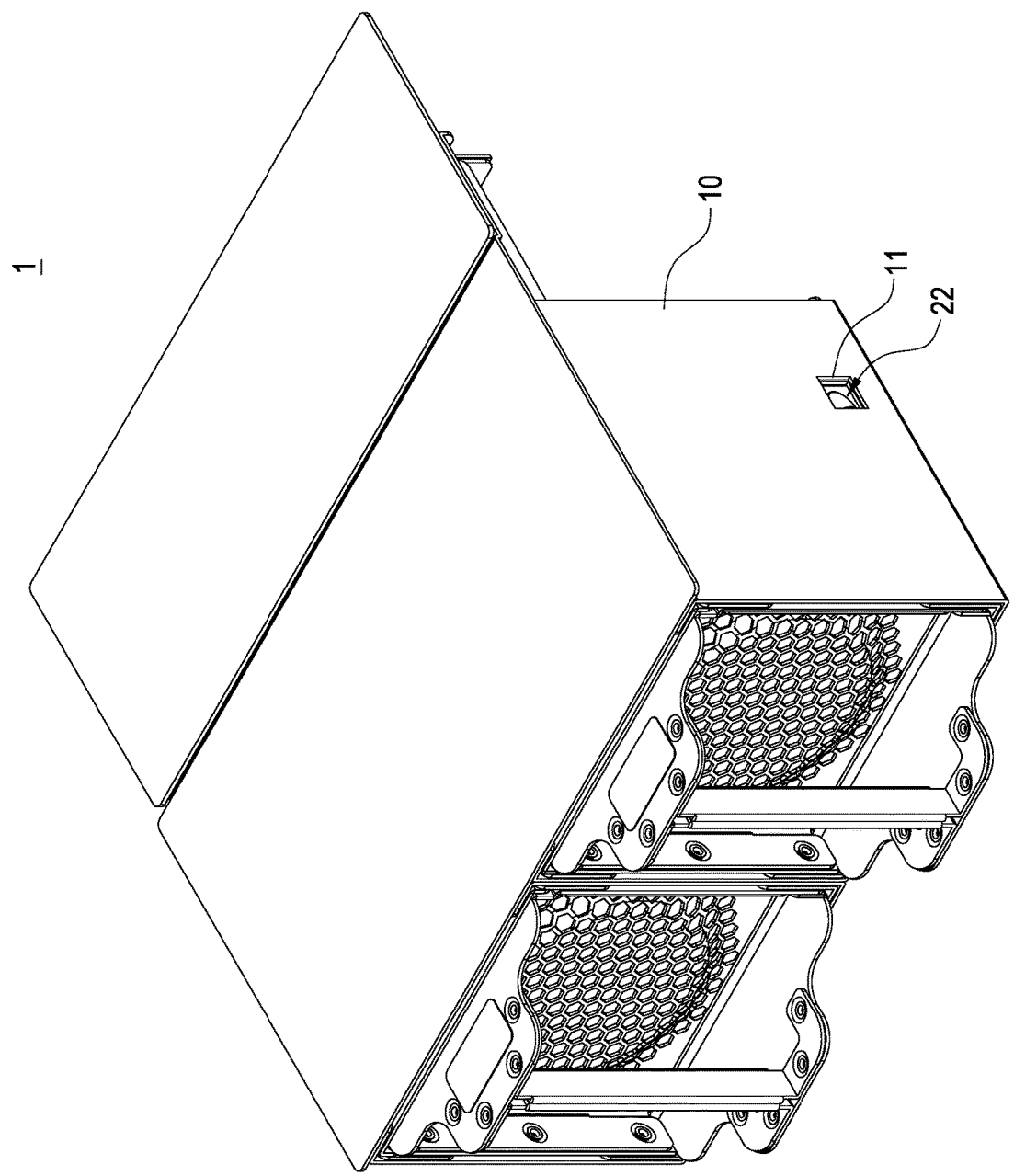
FIG. 8 is a perspective schematic view of the removable self-unlocking structure combined with multiple frame bodies of the present invention.

Please refer to FIG. 7 to FIG. 10, which depict a perspective schematic view of the removable self-unlocking structure, a perspective schematic view of the removable self-unlocking structure combined with multiple frame bodies, a cross sectional schematic view of multiple removable self-unlocking structures combined with multiple frame bodies and a partial enlarged schematic view of the present invention. As shown in FIG. 7 and FIG. 8, the case 10 is provided with a plurality of accommodation spaces 200, and the case 10 is provided with a latching portion 11 (a locking hole) at two sides of each accommodation space 200 separately. After the removable self-unlocking structure 1 inserting into the accommodation space 200, the removable self-unlocking structure 1 can be positioned in the case 10 through the positioning structures 22.

Figure 9:
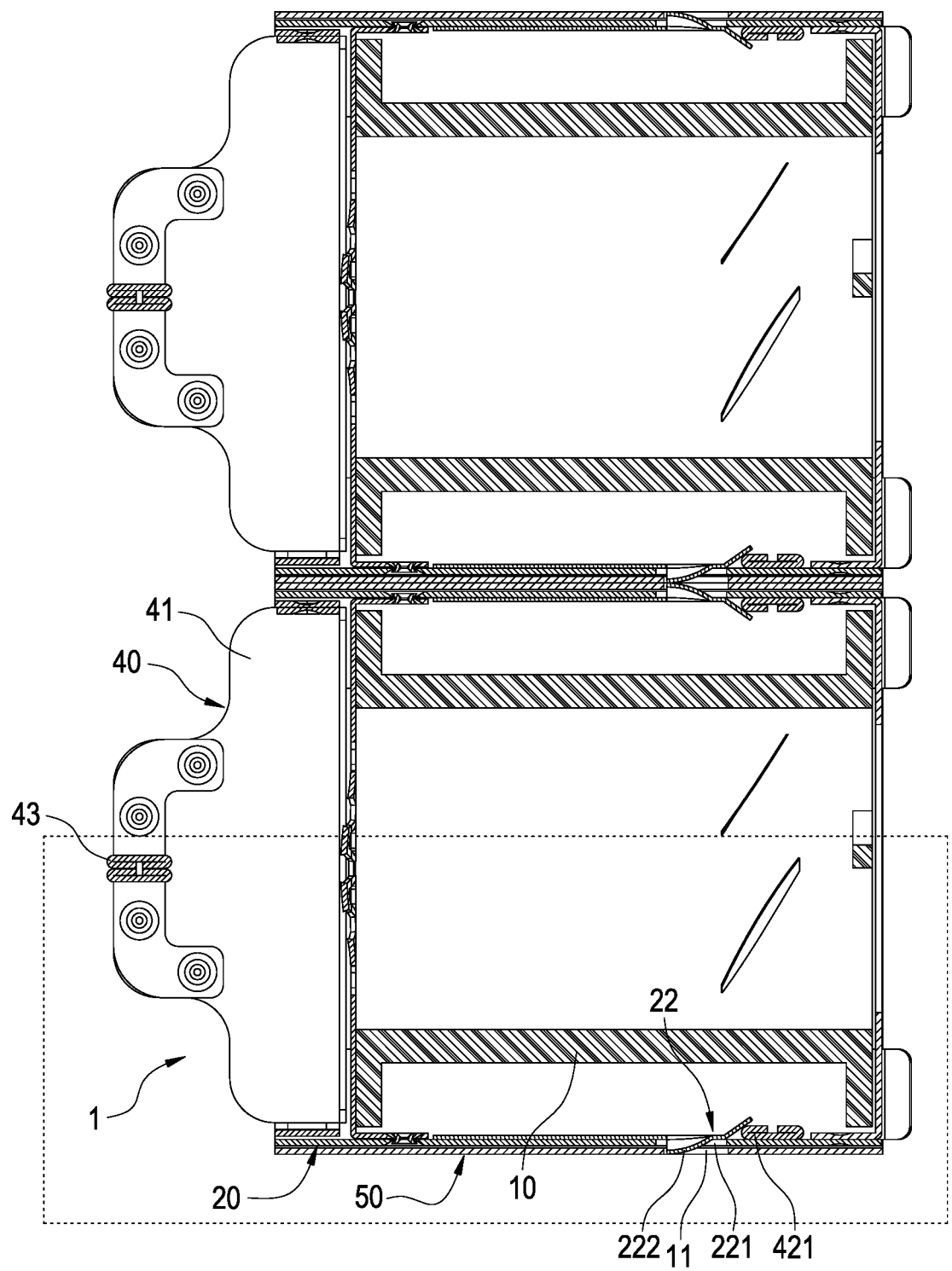
FIG. 9 is a cross sectional schematic view of multiple removable self-unlocking structures combined with multiple frame bodies of the present invention.
Figure 10:
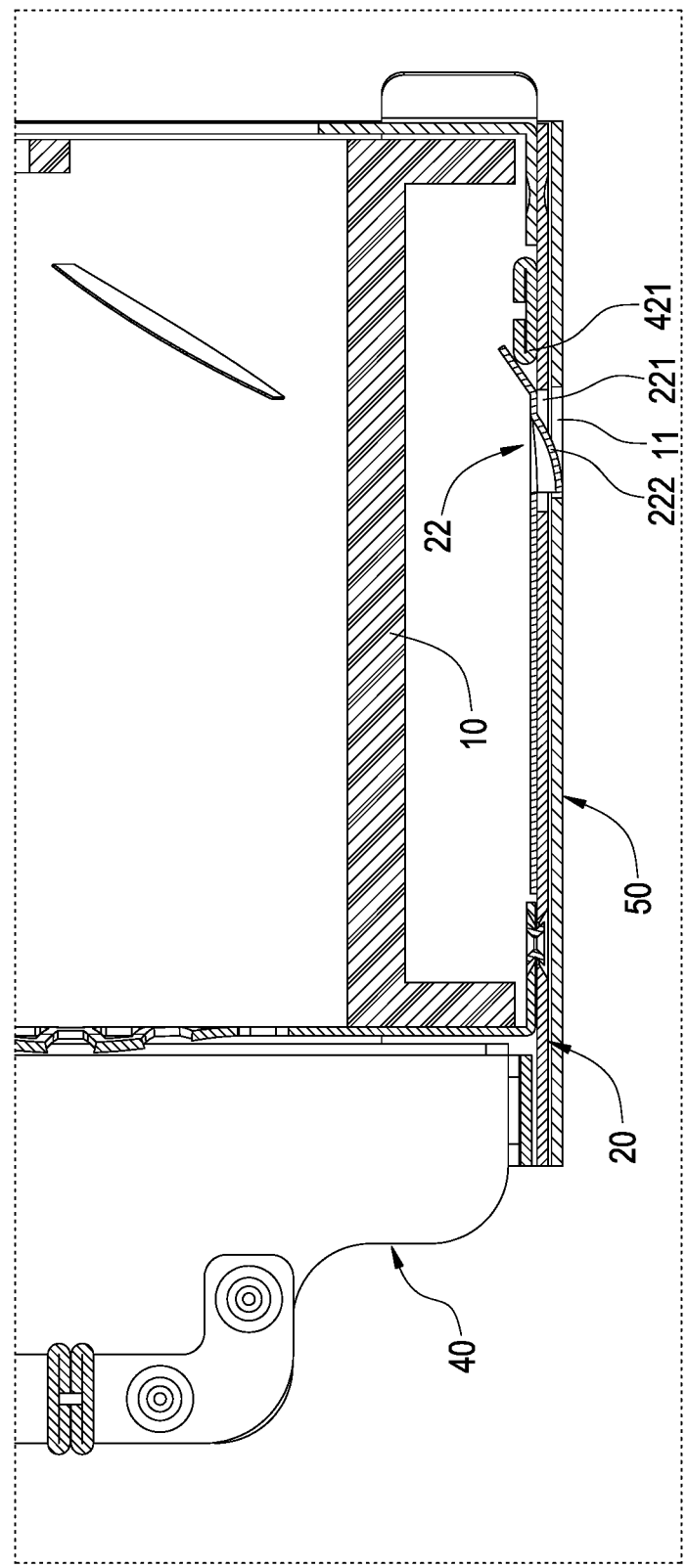
FIG. 10 is a partial enlarged schematic view of FIG. 9.

Moreover, as shown in FIG. 9 and FIG. 10, when the removable self-unlocking structure 1 is positioned in the case 10, the elastic arm 222 exposed in the slot 221 will engage with the latching portion 11 of the case 10. In addition, the pushing portion 421 of the supporting plate 42 (see FIG. 3) will locate at a side of the elastic arm 222.

Figure 11:
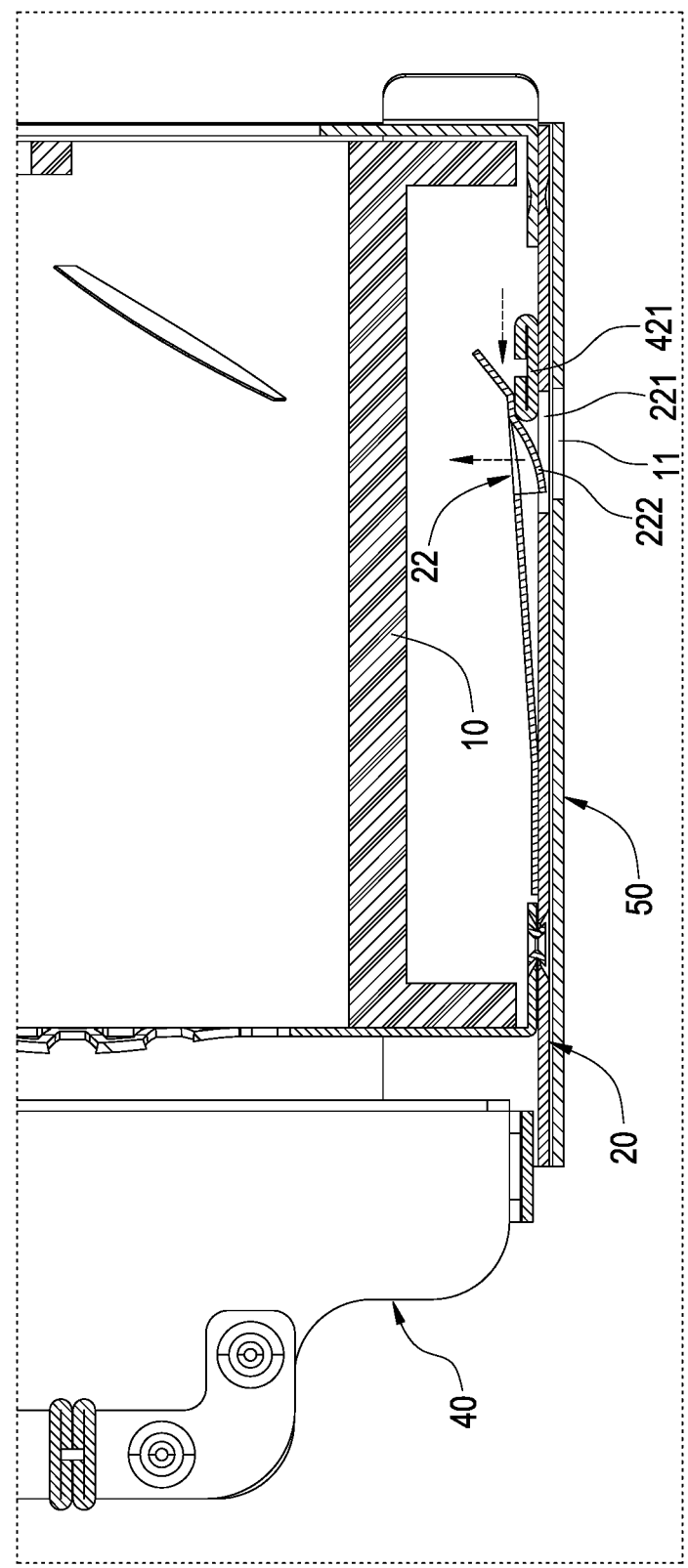
FIG. 11 is an operation schematic view of the removable self-unlocking structure of the present invention.

With referring to FIG. 11, it depicts an operation schematic view of the removable self-unlocking structure of the present invention. In use, an external force is exerted on the handle 43 to drive the removable self-unlocking structure 1 sliding in the case 10. At this time, the pushing portion 421 of the supporting plate 42 (see FIG. 3) can push the elastic arm 222 away from the latching portion 11 (locking hole); thereby, the elastic arm 222 can be disengaged from the latching portion 11 of the case 10 by the external force. Therefore, the removable self-unlocking structure 1 can be removed from the case 10.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A removable self-unlocking structure, comprising:
   a case having a latching portion;
   a frame body including a frame plate; the frame plate being disposed with a positioning structure, and the positioning structure including a slot and an elastic arm having at least one part thereof exposed in the slot; wherein, when the frame body is exerted by an external force, the elastic arm is capable of positioning at the latching portion or detaching from the latching portion, so that the frame body can slide relative to the case;
   a device body, wherein the frame plate covers the device body outside and is fixed on the device body; and
   a protection plate provided with a plurality of ventilation holes, wherein the device body is a fan, and the device body has an air inlet side and an air outlet side, and the protection plate is arranged at an outer side of the air inlet side.

2. The removable self-unlocking structure according to claim 1, wherein two frame plates located on opposite sides of the device body are provided with a positioning structure separately, and opposite sides of the case are provided with a latching portion separately corresponding to the positioning structures.

3. The removable self-unlocking structure according to claim 1, further including a holding assembly, wherein the holding assembly is disposed at an outer side of the frame body and is fixed thereon; wherein the holding assembly includes a supporting frame, a pair of supporting plates coupled to opposite sides of the supporting frame, and a handle coupled to the supporting frame; and two ends of the handle are fixed on opposite sides of the supporting frame.

4. The removable self-unlocking structure according to claim 3, further including a holding assembly, wherein a bottom of each of the support plates is folded to form a pushing portion, and the pushing portion is provided to push the elastic arm away from the latching portion.

5. The removable self-unlocking structure according to claim 1, wherein the elastic arm is a spring piece disposed separately; the elastic arm has a fixed end and a positioning end; the fixed end is riveted on a side of the frame plate facing the device body; and the frame body is positioned on the case through the positioning end engaging with the latching portion; wherein the positioning end has a bump, and the latching portion is a locking hole.

6. The removable self-unlocking structure according to claim 5, wherein the frame plate is disposed with at least one blocking post on a side of the frame plate facing the device body, and the at least one blocking post abuts against an edge of the elastic arm.

7. A removable self-unlocking structure, comprising:
a case having a latching portion;
a frame body including a frame plate; the frame plate being disposed with a positioning structure, and the positioning structure including a slot and an elastic arm having at least one part thereof exposed in the slot; wherein, when the frame body is exerted by an external force, the elastic arm is capable of positioning at the latching portion or detaching from the latching portion, so that the frame body can slide relative to the case; and
a holding assembly, wherein the holding assembly is disposed at an outer side of the frame body and is fixed thereon,
wherein the holding assembly includes a supporting frame, a pair of supporting plates coupled to opposite sides of the supporting frame, and a handle coupled to the supporting frame; and two ends of the handle are fixed on opposite sides of the supporting frame.

8. The removable self-unlocking structure according to claim 7, wherein a bottom of each of the support plates is folded to form a pushing portion, and the pushing portion is provided to push the elastic arm away from the latching portion.

9. The removable self-unlocking structure according to claim 7, wherein the elastic arm is a spring piece disposed separately; the elastic arm has a fixed end and a positioning end; the fixed end is riveted on a side of the frame plate facing the device body; and the frame body is positioned on the case through the positioning end engaging with the latching portion; wherein the positioning end has a bump, and the latching portion is a locking hole.

10. The removable self-unlocking structure according to claim 9, wherein the frame plate is disposed with at least one blocking post on a side of the frame plate facing the device body, and the at least one blocking post abuts against an edge of the elastic arm.

11. The removable self-unlocking structure according to claim 9, wherein two frame plates located on opposite sides of the device body are provided with a positioning structure separately, and opposite sides of the case are provided with a latching portion separately corresponding to the positioning structures.

12. A removable self-unlocking structure, comprising:
a case having a latching portion; and
a frame body including a frame plate; the frame plate being disposed with a positioning structure, and the positioning structure including a slot and an elastic arm having at least one part thereof exposed in the slot; wherein, when the frame body is exerted by an external force, the elastic arm is capable of positioning at the latching portion or detaching from the latching portion, so that the frame body can slide relative to the case,
wherein the elastic arm is a spring piece disposed separately; the elastic arm has a fixed end and a positioning end; the fixed end is riveted on a side of the frame plate facing the device body; and the frame body is positioned on the case through the positioning end engaging with the latching portion;
wherein the positioning end has a bump, and the latching portion is a locking hole.

13. The removable self-unlocking structure according to claim 12, wherein the frame plate is disposed with at least one blocking post on a side of the frame plate facing the device body, and the at least one blocking post abuts against an edge of the elastic arm.

14. The removable self-unlocking structure according to claim 12, wherein the bump is nail-shaped and exposed in the slot.

15. The removable self-unlocking structure according to claim 12, further including a protection plate provided with a plurality of ventilation holes, wherein the device body is a fan, and the device body has an air inlet side and an air outlet side, and the protection plate is arranged at an outer side of the air inlet side.

16. The removable self-unlocking structure according to claim 12, further including a holding assembly, wherein the holding assembly is disposed at an outer side of the frame body and is fixed thereon; wherein the holding assembly includes a supporting frame, a pair of supporting plates coupled to opposite sides of the supporting frame, and a handle coupled to the supporting frame; and two ends of the handle are fixed on opposite sides of the supporting frame.

17. The removable self-unlocking structure according to claim 16, further including a holding assembly, wherein a bottom of each of the support plates is folded to form a pushing portion, and the pushing portion is provided to push the elastic arm away from the latching portion.

18. The removable self-unlocking structure according to claim 16, wherein two frame plates located on opposite sides of the device body are provided with a positioning structure separately, and opposite sides of the case are provided with a latching portion separately corresponding to the positioning structures.

\* \* \* \* \*